United States Patent [19]

Huff et al.

[11] 4,453,159
[45] Jun. 5, 1984

[54] SELF-MONITORING HEAT TRACING SYSTEM

[75] Inventors: Greg Huff, San Marcos; John Gardner, Seguin, both of Tex.

[73] Assignee: Thermon Manufacturing Company, San Marcos, Tex.

[21] Appl. No.: 305,933

[22] Filed: Sep. 28, 1981

[51] Int. Cl.³ .............................................. G08B 17/02
[52] U.S. Cl. .................................. 340/590; 200/61.08; 219/535; 340/596; 340/640
[58] Field of Search ....................... 340/596, 640, 590; 219/517, 535; 337/4; 200/61.08

[56] References Cited

U.S. PATENT DOCUMENTS

| | | |
|---|---|---|
| 259,816 | 6/1882 | Charpentier . |
| 647,556 | 4/1900 | Crone . |
| 664,966 | 1/1901 | Munker . |
| 673,903 | 5/1901 | Gould . |
| 1,235,028 | 7/1917 | Harsch . |
| 2,518,788 | 8/1950 | Jackson et al. . |
| 2,719,902 | 10/1955 | Flynn . |
| 2,820,085 | 1/1958 | Crowley ................... 340/596 X |
| 3,643,245 | 2/1972 | Jones et al. . |
| 3,757,086 | 9/1973 | Indoe . |
| 3,814,399 | 6/1974 | Melreit . |
| 4,072,848 | 2/1978 | Johnson et al. . |
| 4,117,312 | 9/1978 | Johnson et al. . |
| 4,253,011 | 2/1981 | Hinz ........................... 219/535 X |

FOREIGN PATENT DOCUMENTS 211173  1/1957  Australia ............................ 340/596

Primary Examiner—David L. Trafton
Attorney, Agent, or Firm—Pravel, Gambrell, Hewitt, Kirk & Kimball

[57] ABSTRACT

A self-monitoring heat tracing system including a heating conductor, a monitor conductor, and a control circuit which monitors the integrity of the heat tracing conductor and provides alarm signals to indicate abnormal temperature conditions in the heating system or discontinuities in the monitor circuit.

20 Claims, 4 Drawing Figures

SELF-MONITORING HEAT TRACING SYSTEM

BACKGROUND OF THE INVENTION

1. Field of the Invention

The present invention relates to heat tracing systems for heating pipes, conduits, tanks and like objects using a heat tracing cable.

2. Description of the Prior Art

Electric cable fire alarm systems using heat sensitive conductors were disclosed in U.S. Pat. No. 259,816; 647,556; 664,966; 673,903; 1,235,028; and 2,518,788. These patents were fire alarm systems which used heat sensitive cable to trigger an alarm bell or other device when the ambient temperature was elevated by the occurrence of a fire. These fire alarm systems did not, however, control the supply of heat by the cable to an existing structure, monitor the integrity of the alarm system cable or permit one to locate where there was an abnormally high temperature along the cable.

U.S. Pat. No. 3,814,399 disclosed a control circuit for electric heating blankets wherein current was diverted from the heating coductor through a negative thermal coefficient material to cause the interruption of power to the heating conductor to prevent thermal runaway in the heating conducting elements. This control circuitry required the use of the heating conductor as a part of the control circuit which is undesirable and impractical for heat tracing systems. The control circuitry also required the introduction and maintenance of a voltage phase differential between the heating conductor and the control conductor along the entire length of the conductors. U.S. Pat. No. 3,643,245 disclosed a heat-detecting system which used an elongated negative thermal coefficient thermistor to detect high temperature conditions. However, neither of these patents monitored the integrity of the control circuit or located where the high temperature condition existed in the heat conductor.

Electrical heating cables and tapes, as exemplified by U.S. Pat. Nos. 2,719,902; 3,757,086; 4,072,848; and 4,117,312 have been used commercially for some time to provide heat to pumps and other objects in cold environments. U.S. Pat. Nos. 4,072,848 and 4,112,312 are owned by the assignee of the present application. In the past, control of the temperature of these heating cables was achieved by an external thermostat to interrupt the flow of electrical current to the heating cable at a specified temperature limit or by providing current limiting devices in the heating cable. Externally monitored systems were prone to failure, causing thermal runaway in the heating cable possibly resulting in degredation or destruction of the heating cable. While heating cables provided with integral current limiting control devices had the desirable feature of being positioned coextensively with the actual heater device, a malfunctioning or defective current limiting device could not be detected in advance of a failure, and such systems did not provide an indication of the occurrence or the location of an abnormal temperature condition.

SUMMARY OF THE INVENTION

Briefly, the present invention provides a new and improved self-monitoring heat tracing system, which monitors the temperature conditions along a heat-traced system and provides an alarm signal indicative of abnormal temperature conditions. The location of an abnormal temperature condition may be determined from measurements of the impedance values of the system. An alarm signal indicative of faults in the temperature monitoring cable is also provided.

The system includes a heater conductor for heating the specified object or objects, a monitor conductor, coextensive with the heater conductor and having a temperature dependent electrical impedance, and an alarm circuit which measures the impedance of the monitor conductor and forms an alarm signal in response to variations therein. The measured impedance of the monitor conductor is compared to a predetermined reference value and an alarm signal is provided if a high or low variation from the reference value is detected. The location of an abnormal temperature condition is determined by measuring the impedance of the monitor conductor from a reference point to the location of the abnormal condition.

DESCRIPTION OF THE PREFERRED EMBODIMENT

Figure 2:
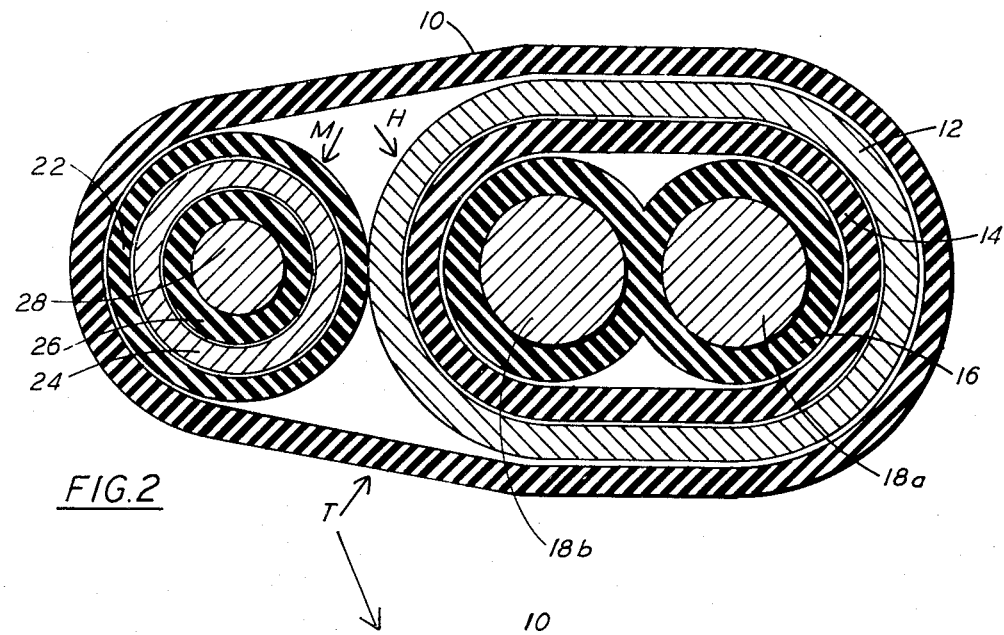
FIG. 2 is a cross-sectional view of the cable of FIG. 1.
Figure 1:
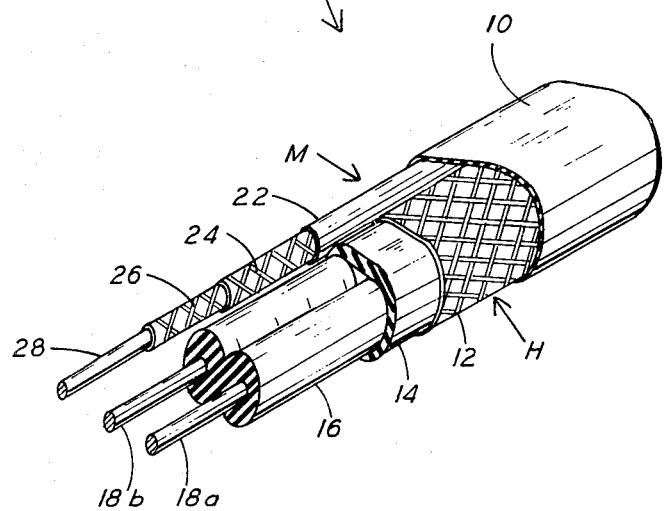
FIG. 1 is a isometric view of a tracing cable in accordance with the present invention.

In the drawings, the letter S designates a heat tracing system of the present invention which may be used to heat pipes, conduits, tanks and like objects in cold environments and elsewhere. The system S includes tracing cable T (FIGS. 1 and 2) which is mounted to the object to be heated and alarm circuit C (FIG. 3) connected to cable T which forms an alarm signal indicative of abnormal temperature conditions or discontinuities along cable T. The cable T includes heater conductor H and monitor conductor M (FIGS. 1 and 2).

Heater conductor H is supplied with electrical power from a remote power source and provides heat as a result of electric current flowing therethrough. Monitor conductor M is mounted to lie coextensively with heater conductor H within cable T. Conductor M monitors the temperature conditions of heater conductor H throughout the heat-traced systems. To simplify installation, storage and shipment, conductors M and H are included in a common insulator cable jacket 10 which may be applied around conductors M and H using known extrusion techniques. Insulator jacket 10 maintains monitor conductor M and heater conductor H in close proximity and insulates the assembly from surrounding objects. Insulator jacket 10 may be made of flourocarbon resin, a thermoplastic elastomer, or any other suitable insulating material.

Insulator jacket 10 of heater conductor H contains a braided jacket 12 (FIGS. 1 and 2) wrapped about insulator sleeves 14 and 16. Within insulator sleeve 16 are electrical conductors 18a and 18b arranged in the manner illustrated (FIGS. 1 and 2). Conductors 18a and 18b are electrical resistance heating elements which carry electrical current provided from a suitable power source to heat the object to which cable T is applied. Conductors 18a and 18b may be any suitable commercially available type, such as that sold as #16AWG conductor, or any other conductor material suitable for heating purposes. Alternatively, conductor H may be a parallel configuration heating cable, wherein parallel resistance heating elements are connected between conductors 18a and 18b at multiple points along the length of conductor H. Particular voltage and heating characteristics of heater conductor H may be selected by selecting the diameter and composition of conductors 18a and 18b and insulators 14 and 16 in a known manner, larger diameter higher voltage rated heating conductors 18a and 18b being used to provide higher temperature levels and smaller conductors having lower voltage ratings generally being used at lower temperature levels.

Conductors 18a and 18b are insulated from each other by portions of inner insulator 16 and from braided jacket 12 by insulator casing 14. Insulator casing 14 and inner insulator 16 may be made of fluorocarbon resin, thermoplastic elastomer, or any other suitable insulator material. Braided jacket 12 is a woven conductive braid which provides a fault or safety return ground path for heater conductor H in the event that the conductor H is damaged, and may be made of copper, stainless steel, copper/tin alloy, or any other suitable conductive material.

The electrical power consumed by current flowing through conductors 18a and 18b generates heat which is dissipated by cable T to provide heat to the object being heated.

Monitor conductor M (FIGS. 1 and 2) includes outer insulator 22, conductor 24, inner insulator 26 and conductor 28. Insulator 22 may be formed of fluor-carbon resin, thermoplastic elastomer or any other suitable insulating material which provides electrical insulation but permits the transfer of heat from the outer surroundings to the inner elements of monitor conductor M.

Conductors 24 and 28 and insulator 26 form an electrical network having a temperature dependent electrical impedance. Under normal operating temperature conditions of heating cable H, insulator 26 electrically separates conductors 24 and 28 so that the resistance measured between conductors 24 and 28 is relatively large. If abnormally high temperature conditions arise in heating conductor H at some location along its length, the electrical resistance between conductors 24 and 28 decreases dramatically. In one embodiment of the present invention, (FIGS. 1 and 2), conductor 28 is formed of a fusible alloy which melts when heated to a predetermined level and diffuses through insulator 26 to contact conductor 24 thereby completing a short-circuit, low-resistance path between conductors 24 and 28. In this embodiment, conductor 28 is formed of a fusible alloy having predetermined characteristics, so that its melting point (hereinafter temperature rating) may be selected to suit particular applications. Since it is desired that conductor 28 melt only under abnormally high temperature conditions, the alloy is selected so that its temperature rating is above the normal operating temperature conditions of heater conductor H. The normal operating temperature conditions may be selected with reference to either the object to be heated or the temperature rating of conductor H, so that the monitor circuit protects the integrity of the heated object or that of conductor H. Furthermore, to insure the integrity of insulator 22 will be maintained, the alloy is selected so that its temperature rating is below the melting point of insulator 22. Variations in the composition of outer insulator material 22 affect the temperature rating of monitor conductor M and are also a factor in the temperature rating determination. The following specifications for particular example temperature ratings of monitor conductor M have been found to be suitable:

| Temperature Rating (±3° F.) | Composition of Conductor 28 | Dimension of Conductor 28 (inches) | Composition of Insulator 22 | Thickness of Insulator 22 |
|---|---|---|---|---|
| 200° F. | 52.5% Bismuth 32% Lead 15.5% Tin | .0624 (16AWG) | styrene ethylene butylene three block copolymer | 12 mils |
| 300° F. | 50% Tin 32% Lead 18% Cadmium | .040 (18AWG) | styrene ethylene butylene three block copolymer | 12 mils |
| 390° F. | 91.1% Tin 8.9% Zinc | .040 (18AWG) | fluorocarbon resin | 12 mils |

Insulator 26 (FIGS. 1 and 2) may be formed of a porous material or may be a braid of material such as fiberglass so that conductor 28, when fluid, may diffuse through insulator 26 to contact conductor 24. Conductor 24 may be formed of any suitable conductor material, including but not limited to copper, aluminum, or steel braid. Monitor conductor M as well as heater conductor H are each manufactured using known extrusion processes and the completed conductors M and H paired inside insulator jacket 10 as described above.

The completed heat tracing cable T, which includes monitor conductor M and heater conductor H is mounted to the object to be heated. Monitor conductor M, in a manner described below, monitors the temperature conditions prevailing along conductor H as well as the integrity of a monitoring circuit which includes monitor conductor M. In the event of abnormally high temperature conditions along heater conductor H, fusible alloy conductor 28 of conductor M melts in the manner described above to complete a short circuit path through insulator 26 to conductor 24 which, in a manner described below, causes an alarm to be provided to a system operator.

Figure 3:
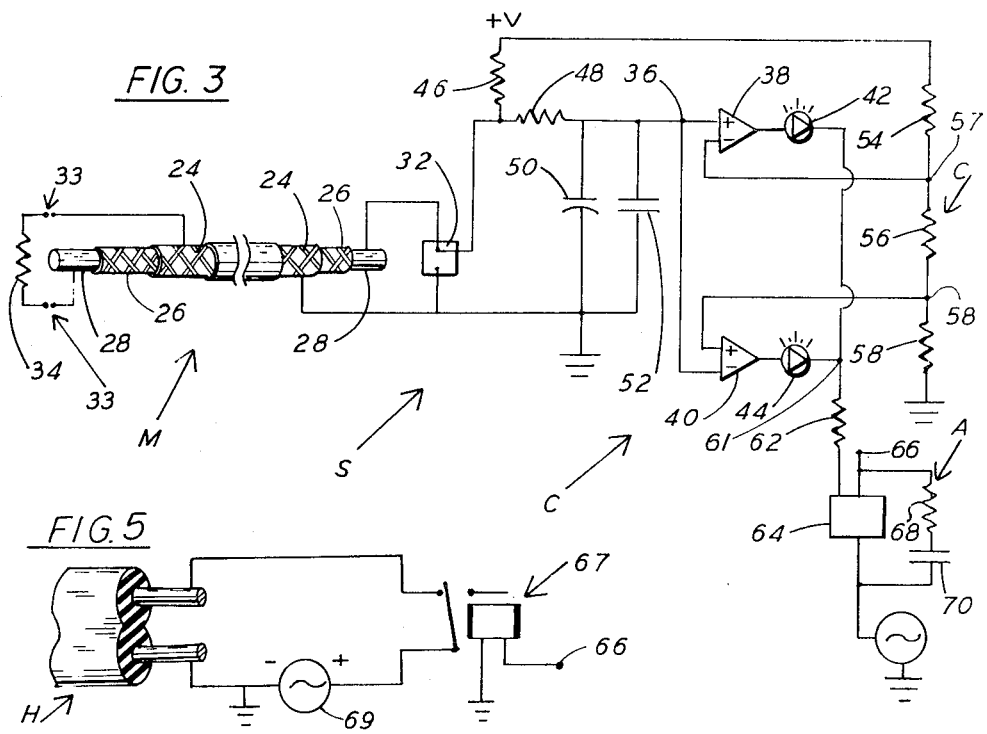
FIG. 3 is a schematic electrical circuit diagram of a monitoring circuit for the cable of FIG. 1 according to the present invention.

Control circuit C (FIGS. 3 and 4) is connected to monitor conductor M of cable T, and forms an alarm signal indicative of variations in the impedance measured from conductor 28 across insulator 26 to conductor 24. When temperatures along the monitored heater conductor H rise to the temperature rating of conductor M, the resistive impedance measured from conductor 28 through insulator 26 to conductor 24 (FIG. 3) decreases dramatically. A virtual short circuit thus exists through insulator 26 at the location of abnormal high temperatures, and thus the resistance measured between conductors 24 and 28 is substantially due to the resistance of the lengths of conductors 24 and 28 from the point of measurement to the location of the high temperature condition. Typically, conductor M is routed from a source terminal 32 along the heat-traced path to an end terminal 33 (FIG. 3). Each of terminals 32 and 33 are provided with two connection jacks or plugs, conductors 24 and 28 being connected between corresponding terminal plugs of terminals 32 and 33, respectively, as indicated.

Control circuit C is connected to terminal 32 and measures the resistance of the circuit loop formed by conductor 24, the short circuit path across insulator 26, and cnductor 28. Thus, if an abnormally high temperature condition arises at some point along the length of monitor conductor M, the resistance measured at terminal 32 is aubstantially due to the resistance of conductors 24 and 28 from terminal 32 to the point of the high temperature condition, and is a relatively low value. On the other hand, the resistance measured at terminal 32 under normal temperature conditions (where no high temperature condition has occurred) is a relatively high value.

The control circuit C is an impedance comparator circuit which compares the impedance of monitor conductor M at terminal 32 to a preset reference value and forms an alarm signal when the measured impedance varies from the preset reference values. Under normal temperature conditions, the loop impedance from conductor 24 to conductor 28 includes a path through insulator 26, thereby causing the measured impedance to be extremely high. Such a situation does not readily allow a discontinuity in either conductor 24 or 28 to be detected. However, a fixed impedance circuit 34 having an impedance value substantially lower than that which would be measured across insulator 26, is provided in parallel between conductors 24 and 28 (FIG. 3) between the plugs of terminal 33. Circuit 34 may be a resistor of predetermined value and is preferably selected to have an impedance substantially higher than the short circuit impedance which exists in monitor cable M under abnormally high temperature conditions and substantially lower than the open circuit impedance present under normal conditions from conductor 24 across insulator 26 to conductor 28. In this manner, circuit C may detect the high temperature short circuit condition between conductors 26 and 28 as well as the discontinuity open circuit condition by measuring the impedance at terminal 32. Where the impedance measured at 32 substantially exceeds that of the loop formed by conductor 24, circuit 34 and conductor 28 an open circuit condition is indicated. When the impedance measured at terminal 32 is substantially less than that of the loop formed by conductor 28, circuit 34 and conductor 24, a high temperature or short circuit condition is indicated. Indications that a high temperature condition or an open circuit condition have occurred are provided to an operator in the manner described below.

The location of a high temperature condition relative to terminal 32 may be determined by comparing the impedance of the circuit loop formed at terminal 32 by conductor 24, the short circuit across insulator 26, and conductor 28, to the known value of impedance per foot of cnductors 24 and 28. If for example, the measured loop impedance was ten thousand ohms and conductors 24 and 28 had a combined impedance per foot of one hundred ohms, a distance of approximately one hundred feet from terminal 32 to the high temperature condition is indicated. Where it is desired to ascertain the location of the high temperature event, monitor conductor M is disconnected from the circuit C at terminal 32, and the impedance of monitor conductor M is measured using an external ohmmeter. The ohmmeter is provided with a meter scale calibrated in feet or other distance units based upon the substantially linear relationship between the measured impedance and the distance to the high temperature conditions. A switch is provided to disconnect circuit C from conductor M for this purpose.

Control circuit C is an impedance comparator circuit which compares the voltage at terminal 36 (FIG. 3) which is dependent upon the input impedance connected to terminal 32, to a predetermined reference voltage. Control circuit C includes operational amplifier comparators 38 and 40 which provide output signals to enable light emitting diodes 42 and 44, respectively, when a positive voltage differential is provided at their input terminals. Diodes 42 and 44 are light-emitting diodes mounted to be visible to an operator and provide visual alarm indications in the event of either an abnormal temperature condition or heater conductor H or an open circuit fault in the monitor circuit. The voltage at terminal 36 (FIG. 3) is provided as a positive input to amplifier 38 and as a negative input to amplifier 40. Thus, when the voltage at terminal 36 exceeds the voltage provided to the negative input terminal of amplifier 38 by an enabling or threshold amount, amplifier 38 provides an output signal to enable diode 42. Conversely, when the voltage at terminal 36 is less than the voltage provided as a positive input to amplifier 40 by a threshold amount, amplifier 40 provides an output signal to enable diode 44.

When the resistive impedance at terminal 32 is very low (indicating a short-circuit condition) indicative of an abnormally high temperature condition on conductor M, the voltage at terminal 36 drops substantially lower than its normal operating level. The voltage provided at terminal 36 is dependent upon the impedance of monitor conductor M connected to terminal 32. The impedance connected to terminal 32 forms a part of voltage divider network which also includes a resistor 46 and resistor 48. In short-circuit conditions current readily flows from voltage supply V through resistor 46 and around the short-circuit loop formed in conductor M. Capacitors 50 and 52 are connected in parallel between resistor 48 and terminal 36 and discharge under short circuit conditions causing an initial negative pulse voltage at terminal 36, thereafter, changing to rise to be substantially equal to the voltage at terminal 32. The voltage at terminal 32 remains at a relatively low level as long as the short circuit condition exists, since the majority of voltage drop in the circuit is across resistor 46. The voltage at terminal 36 is provided as a negative input to amplifier 40 which compares this voltage to that at the junction of resistors 56 and 58 (FIG. 3). Resistors 54, 56 and 58 are connected in series to positive supply voltage V and form a series voltage-divider network. The voltage provided at the junctions of resistors 54, 56 and 58 under particular circuit conditions may be predetermined and selected by selecting the impedance values of resistors 54, 56 and 58. The voltage at the junction of resistors 56 and 58 which is provided as a positive input to amplifier 40 approaches the level of positive supply voltage V when a short circuit condition exists. The positive differential voltage between that at terminal 36 and that at the junction of resistors 56 and 58 is provided to amplifier 40. When this voltage reaches a threshold, it enables amplifier 40, and causes an enabling output signal to be provided to diode 44.

On the other hand, when a discontinuity exists in the circuit comprised of terminal 32, conductors 24 and 28 and resistor 34, the impedance at terminal 32 is relatively high, an open circuit condition, and the voltage at terminal 36 approaches positive supply voltage V. This relatively high voltage at terminal 36 is compared by amplifier 38 to that provided at the junction of resistors 54 and 56. In the open circuit condition, the majority of current will be diverted through resistors 54, 56 and 58 to ground and substantial voltage drop from the level of supply voltage V occurs across resistor 54. The voltage provided as an input to amplifier 38 under open circuit conditions may be preset by selecting the impedance values of resistors 54, 56 and 58. The voltage differential thus provided to amplifier 38 on reaching a threshold under open circuit conditions enables amplifier 38 causing an enabling output signal to be provided to diode 42.

Under normal operating conditions, i.e. where neither a short circuit nor open circuit condition exists, the impedance at terminal 32 is set by selecting the impedance value of resistor 34. By selecting the impedance value of resistor 34 to be a median value between the relatively low short circuit condition impedance (typically less than one thousand ohms) and the relatively high open-circuit condition impedance (typically greater than one megohm) a "normal" reference impedance at terminal 32 and a reference voltage at terminal 36 may be established. Once a value for the impedance of resistor 34 is selected, the impedance values of the remaining circuit elements of control circuit C are selected such that the open circuit and short circuit conditions cause substantial voltage variation from the reference voltage at terminal 36 in the manner described above.

If either a short circuit or open circuit condition arises, causing diodes 44 or 42, respectively to be illuminated, the voltage at terminal 61 drops to a value substantially lower than the normal condition level. This voltage drop at terminal 61 functions as an alarm trigger signal for alarm circuit A which includes resistor 62, switching circuit 64, and a delay circuit comprised of resistor 68 and capacitor 70. The delay circuit formed by resistor 68 and capacitor 70 delay the alarm signal a predetermined time period set by the respective impedance values of resistor 68 and capacitor 70 to prevent transient alarm signals from enabling the attached alarm device.

Figure 5:
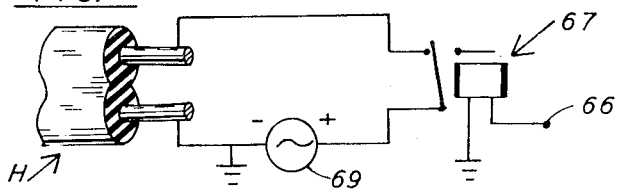

It is desirable to provide an alarm signal which is electrically isolated from the remainder of control circuit C to prevent errant alarms caused by transients in the control circuit C. For this purpose, switching circuit 64 may include a commonly available optically coupled circuit including a light emitting diode and light enabled thyristor pair which provide an output signal to terminal 66 in response to a low voltage trigger signal provided at terminal 61. Any suitable alarm device such as a bell, buzzer, light or the like may be connected to alarm circuit A at terminal 66 to provide the desired visual or audible alarm for the operator. The alarm signal provided at terminal 66 may also be used to activate a relay 67 (FIG. 5) and open a switch 67a to disconnect heater conductor H from the power source 69 in the event of a high temperature condition or discontinuity.

Figure 4:
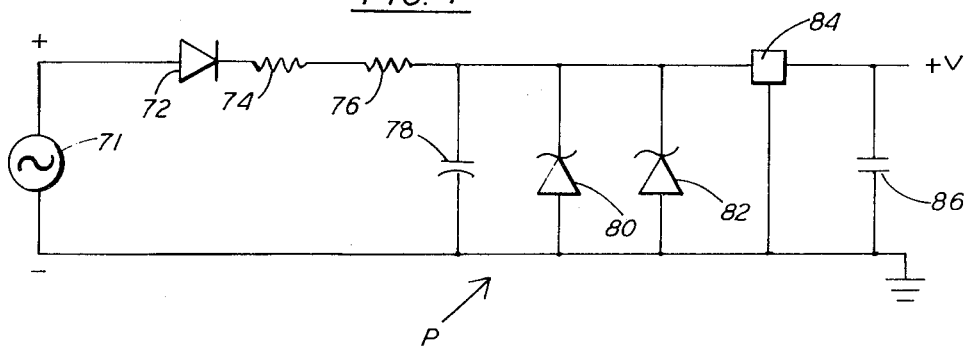
FIG. 4 is a schematic electrical circuit diagram of a portion of the system shown in FIG. 3.

Circuit C is provided with direct current supply voltage by power circuit P (FIG. 4). Circuit P includes: Alternating voltage source 61; half-wave rectifier circuit comprised of diode 72, resistor 74 and 76 and capacitor 78; zener diodes 80 and 82, voltage regulator 84, and capacitor 86; all arranged in the manner illustrated. The power supplied by source 71 is rectified by diode 72 and filtered by capacitor 78. Resistors 74 and 76 are included to reduce the power level of the voltage supplied by source 71. Zener diodes 80 and 82 clamp the source voltage at a predetermined level which is supplied to voltage regulator 84. Regulator 84 and capacitor 86 function in a conventional manner to provide regulated direct current voltage V in the manner illustrated.

SYSTEM AND OPERATION

In operation, heat tracing cable T is mounted to the object or system to be heated, heater conductor H being connected to the electrical power source 69, and monitor conductor M being connected to control circuit C at terminal 32. If either a high temperature condition or a discontinuity in monitor conductor M is detected by a control circuit C an alarm is provided to the operator. The operator may then determine which of the two operative conditions has caused the alarm to be activated by visually inspecting diodes 42 and 44 and take appropriate remedial action. In the event of a high temperature condition, indicated by diode 44, the operator may locate the high temperature condition in the manner described above and remedial action to eliminate the cause of the high temperature condition. If a discontinuity exists as indicated by diode 42, the operator may make appropriate continuity checks and restore the integrity of the monitoring circuit before reactivating the heat tracing system S. In this manner an economical and reliable selfmonitoring heat tracing system is provided. System S not only provides continuous length monitoring of the heat traced cable T, but also enables an operator to determine the location of abnormal temperature conditions and alerts the operator of discontinuity or faults in the temperature monitoring circuit.

The foregoing disclosure and description of the invention are illustrative and explanatory thereof, and various changes in the size, shape, materials, components, circuit elements, wiring connections and contacts, as well as in the details of the illustrated circuitry and construction may be made without departing from the spirit of the invention.

We claim:

1. A self-monitoring heat tracing system for distributing heat from a power source to heat pipes, conduits, tanks or like objects which detects abnormal temperature conditions in the system, comprising:
   (a) heater conductor means connected to the power source for heating the object to be heated;
   (b) monitor conductor means, mounted in proximity to said heater conductor means, having a temperature-dependent electrical impedance; said monitor conductor means comprising:
      a first conductor means formed of a fusible conductive material;
      a second conductor means mounted in proximity to said first conductor means;
      an insulator means formed of a porous material and mounted between said first conductor means and said second conductor means; and,
      means for measuring the electrical impedance between said first conductor means and said second conductor means; wherein said first conductor defuses through said insulator means in response to abnormally high temperature conditions at points along said heater conductor thereby completing an electrical circuit between said first conductor and said second conductor;
   (c) alarm means, connected to said monitor conductor for forming an alarm signal in response to variations in the electrical impedance of said monitor conductor means indicative of abnormal temperature conditions in the system.

2. The system of claim 1, wherein the power source is a source of electrical power, and said heating conductor means comprises an electrical resistance heating conductor.

3. The system of claim 2, wherein said heater conductor means and said monitor conductor means are contained within a single cable jacket, further including;
insulator means, mounted between said heater conductor means and said monitor conductor means, for electrically insulating said heater conductor from said monitor conductor.

4. The system of claim 1, wherein said fusible conductive material is an alloy comprising bismuth, lead and tin.

5. The system of claim 4 wherein said alloy comprises by weight:
about 52.5% bismuth;
about 37% lead; and
about 15.5% tin.

6. The system of claim 1, wherein said fusible conductive material is an alloy comprising tin, lead, and cadmium.

7. The system of claim 6, wherein said alloy comprises by weight:
about 50% tin;
about 32% lead; and
about 18% cadimium.

8. The system of claim 1, wherein said fusible conductive material is an alloy comprising tin and zinc.

9. The system of claim 8, wherein said alloy comprises by weight:
about 91% tin; and
about 9% zinc.

10. The system of claim 1, wherein:
said insulator means is formed of material having a temperature dependent electrical resistance such that the impedance of said monitor conductor measured between said first conductor and said second conductor varies in response to abnormal temperature conditions along said heater conductor.

11. The system of claim 10, wherein said insulator means is formed of material having an electrical resistance which varies inversely with temperature.

12. The system of claim 1, further including:
a reference impedance circuit connected in parallel between said first conductor and said second conductor for setting a reference impedance value.

13. The system of claim 12, wherein said alarm means further includes:
means for forming an alarm signal to indicate that the measured electrical impedance of said monitor conductor is less than the reference value.

14. The system of claim 12 wherein said alarm means further includes:
means for forming an alarm signal to indicate that the measured electrical impedance of said monitor conductor is greater than the reference value.

15. The system of claim 12, wherein said reference impedance circuit comprises a resistor.

16. The system of claim 1, further including:
means for detecting the location of abnormal temperature conditions along said heater conductor means.

17. The system of claim 16, wherein said detecting means includes:
means for measuring at a reference point on said monitor conductor the loop impedance from said first conductor means through said insulator means at the point of the abnormal temperature condition to said second conductor means.

18. The system of claim 17, wherein the impedance characteristics of said monitor conductor are known and said detection means further includes:
means for computing the distance from the reference point on said monitor conductor to the abnormal temperature condition by comparing the known impedance characteristics of said monitor conductor to the measured loop impedance.

19. The system of claim 1, further including:
heater conductor control means responsive to said alarm signal for controlling the amount of heat energy distributed by said heater conductor.

20. The system of claim 19, wherein said control means comprises an electrical switching circuit activated by the alarm signal to disconnect said heater conductor from the power source.

* * * * *

UNITED STATES PATENT AND TRADEMARK OFFICE
CERTIFICATE OF CORRECTION

PATENT NO. : 4,453,159

DATED : June 5, 1984

INVENTOR(S) : Greg Huff; John Gardner

It is certified that error appears in the above-identified patent and that said Letters Patent is hereby corrected as shown below:

Column 3, Line 32: delete "fluor-carbon" and insert therefor --fluorocarbon--.

Column 5, Line 2: delete "cnductor" and insert therefor --conductor--.

Column 5, Line 5: delete "aubstantially" and insert therefor --substantially--.

Column 5, Line 41: delete "when" and insert therefor --where--.

Column 5, Line 52: delete "cnductors" and insert therefor --conductors--.

Column 9, Line 27: delete "cadimium" and insert therefor --cadmium--.

Signed and Sealed this

Sixth Day of November 1984

[SEAL]

Attest:

GERALD J. MOSSINGHOFF

Attesting Officer

Commissioner of Patents and Trademarks